United States Patent [19]

Shibata et al.

[11] Patent Number: 5,243,220
[45] Date of Patent: Sep. 7, 1993

[54] SEMICONDUCTOR DEVICE HAVING MINIATURIZED CONTACT ELECTRODE AND WIRING STRUCTURE

[75] Inventors: Hideki Shibata; Naoki Ikeda, both of Yokohama, Japan

[73] Assignee: Kabushiki Kaisha Toshiba, Kawasaki, Japan

[21] Appl. No.: 912,216

[22] Filed: Jul. 10, 1992

Related U.S. Application Data

[63] Continuation of Ser. No. 659,223, Feb. 22, 1991, abandoned.

[30] Foreign Application Priority Data

Mar. 23, 1990 [JP] Japan .................... 2-72019

[51] Int. Cl.$^5$ .................... H01L 23/48; H01L 29/46; H01L 29/54; H01L 29/62
[52] U.S. Cl. .................... 257/748; 257/750; 257/754; 257/758; 257/760; 257/763; 257/764; 257/774; 257/797
[58] Field of Search .................... 357/71, 68, 65, 67; 257/748, 750, 754, 758, 760, 774, 797, 763, 764

[56] References Cited

U.S. PATENT DOCUMENTS

| | | | |
|---|---|---|---|
| 4,641,170 | 2/1987 | Ogura et al. | 357/68 |
| 4,866,009 | 9/1989 | Matsuda | 357/71 |
| 4,878,105 | 10/1989 | Hirakawa et al. | 357/65 |
| 4,962,414 | 10/1990 | Liou et al. | 357/71 |

FOREIGN PATENT DOCUMENTS 59-200439  11/1984  Japan .
63-73537   4/1988   Japan .
64-57645   3/1989   Japan .

*Primary Examiner*—Andrew J. James
*Assistant Examiner*—Carl Whitehead
*Attorney, Agent, or Firm*—Finnegan, Henderson, Farabow, Garrett & Dunner

[57] ABSTRACT

A contact hole in a diffusion region is narrowed by a buffer layer formed at about the middle of an interlayer insulating film in its thickness direction. This buffer layer serves as effective alignment tolerances to the diffusion region and a contact electrode at the time of forming the contact hole. The structure having a wiring conductor filled in the contact hole and having the contact electrode formed on this wiring conductor can assure a highly reliable contact. Forming a buffer layer as a sidewall on this contact electrode and a first wiring layer formed on the same layer can assure an effective alignment tolerance to the first wiring layer at the time of forming a VIA hole. Filling a wiring conductor in the VIA hole can eliminate the need for any contact tolerance for a second wiring layer to be formed on this wiring conductor. Accordingly, the individual contact tolerances can be assured by self-alignment.

7 Claims, 3 Drawing Sheets

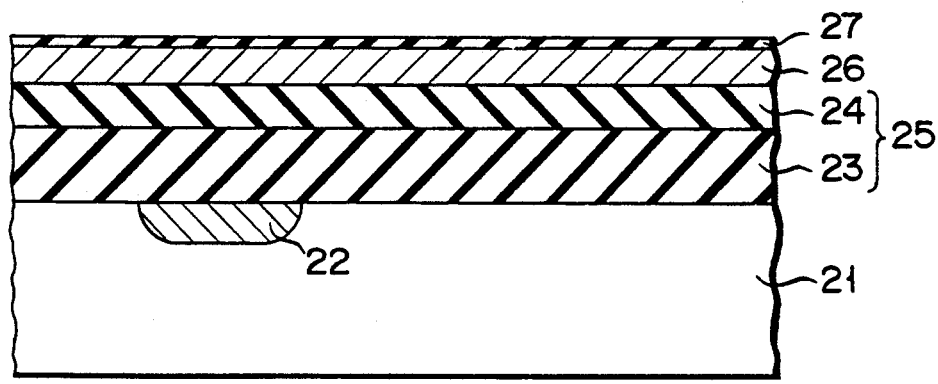
F I G. 2

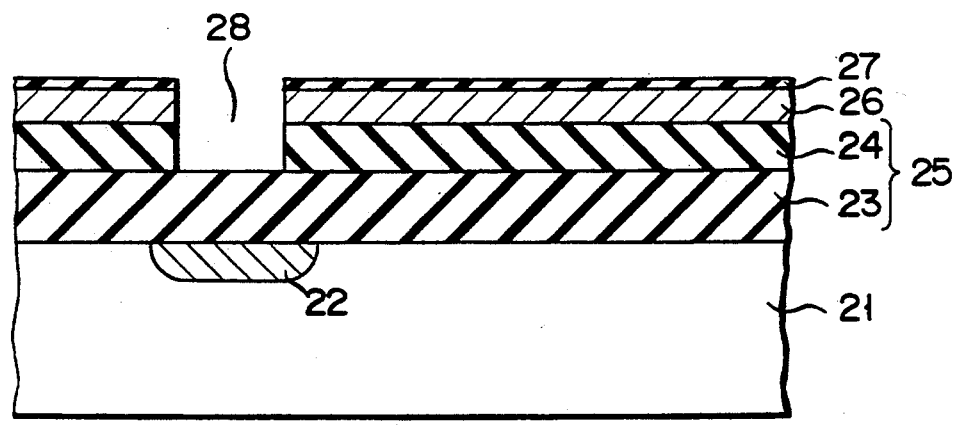
F I G. 3
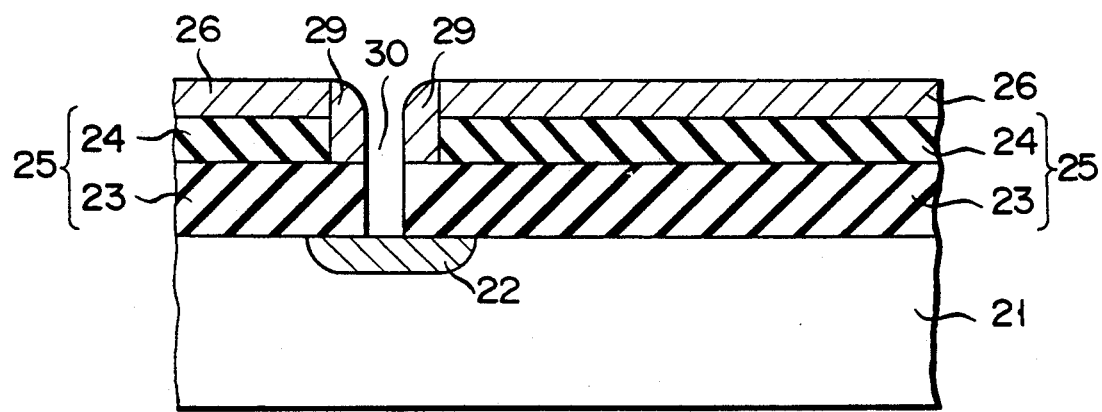
F I G. 4

SEMICONDUCTOR DEVICE HAVING MINIATURIZED CONTACT ELECTRODE AND WIRING STRUCTURE

This application is a continuation of application Ser. No. 07/659,223 filed Feb. 22, 1991, now abandoned.

BACKGROUND OF THE INVENTION

1. Field of the Invention

The present invention relates to a semiconductor device and a method of fabricating the same. More particularly, this invention relates to contact electrodes and a wiring structure, which constitute a semiconductor integrated circuit.

2. Description of the Related Art

FIG. 1 is a cross section illustrating the structure of a contact electrode and metal wiring which are used in a conventional semiconductor device. A method of manufacturing the contact electrode and the metal wiring in the conventional semiconductor integrated circuit will be described. An impurity is implanted into a semiconductor substrate 1 to form a diffusion region 2, then a first interlayer insulating film 3 is formed. Then, the insulating film 3 on the diffusion region 2 is etched by an RIE (Reactive Ion Etching) technique so as to make a contact hole through which the surface of the diffusion region 2 is partially exposed. Further, a metal layer is formed on the insulating film 3 so as to cover the contact hole 4, and first wiring layers 5 and 6 are formed using the photolithography technique and the RIE technique. A second insulating film 7 is formed on the insulating film 3 to cover the wiring layers 5 and 6. A VIA hole 8 is formed in the insulating film 7 on the wiring layer 6 so as to partially expose the surface of the wiring layer 6. Then, a second wiring layer 9 is patterned on the insulating layer 7 so as to cover the VIA hole 8.

According to the above-described manufacturing method, there are mask alignment tolerances as shown by reference numerals, 10, 11, 12, and 13 in FIG. 1: the numeral "10" is a clearance between the diffusion region 2 and the contact hole 4, "11" between the wiring layer 5 and the contact hole 4, "12" between the wiring layer 6 and the VIA hole 8, and "13" between the wiring layer 9 and the VIA hole. If a misalignment occurs even slightly without such clearances, at the time of forming the contact hole 4, for example, the difference in the etching rate will cause the following shortcomings:

That part of the substrate 1 which is not connected to the diffusion layer 2 may be deeply etched; in forming the VIA hole 8, etching may be done on not only that part of the insulating film 3 which is off the wiring layers 6, but also on the substrate 1 through the film 3. This may cause various problems, such as electric shorting between the second wiring layer 9 and the substrate 1 at the time of processing the wiring layer 9.

For prevention of defects caused by the possible variation in mask alignment and in process, the alignment tolerances 10, 11, 12 and 13 between the wiring layers are set to as large as 0.5 to 1.0 μm. These mask alignment tolerances, however, considerably hinder finer patterning of the wiring and the contact size.

SUMMARY OF THE INVENTION

Accordingly, it is an object of the present invention to provide a miniaturized and highly reliable semi conductor device which positively has a wiring structure that does not require particular mask alignment tolerances with predetermined values, and a method of fabricating the same.

To achieve this object, according to one aspect of the present invention, there is provided a semiconductor device comprising:

a semiconductor substrate;

an interlayer insulating film formed on the semiconductor substrate;

a first buffer layer formed on the interlayer insulating film;

a contact hole formed in the interlayer insulating film so as to expose a surface of the semiconductor substrate;

a second buffer layer in contact with the first buffer layer on the interlayer insulating film around the contact hole, a wiring conductor in the contact hole to be electrically connected to the surface of the semiconductor substrate;

a contact electrode selectively formed on the wiring conductor; and a third buffer layer formed as sidewalls of the contact electrode.

According to another aspect of the present invention, there is provided a method of fabricating a semiconductor device, which comprises the steps of:

forming an interlayer insulating film on a semiconductor substrate;

forming a first buffer layer on the interlayer insulating film and a stopper insulating film on the first buffer layer;

selectively forming in the interlayer insulating film a first opening having a bottom inside the interlayer insulating film and shallower than a thickness of the interlayer insulating film;

forming a second buffer layer to cover the first opening and the stopper insulating film;

performing anisotropic etching to leave the second buffer layer on a sidewall of the first opening;

executing anisotropic etching with the first and second buffer layers used a masks to penetrate that part of the bottom of the first opening which is exposed, and forming a second opening to expose a surface of the semiconductor substrate;

filling a wiring conductor in the second opening and the first opening following the second opening;

forming a contact electrode on the wiring conductor filled in the first opening as wide as a width of the first opening; an depositing a third buffer layer to cover the contact electrode, and performing anisotropic etching to leave the third buffer layer on a sidewall of the contact electrode.

According to the present invention, the contact hole is formed in the diffusion region on the substrate surface with the size determined by the second buffer layer. The second buffer layer is formed at about the middle of the interlayer insulating film in its thickness direction. Consequently, it is possible to form a fine contact hole. The second buffer layer provides a effective alignment tolerance to the diffusion region and the contact electrode at the time of forming the contact hole. The structure having the first wiring conductor filled in the contact hole and having the contact electrode formed on this wiring conductor can assure the necessary contact area and is therefore highly reliable.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 2 to 6 are cross sections illustrating the step-by-step fabrication of a semiconductor device having a contact electrode and wiring structure according to the present invention.

DETAILED DESCRIPTION OF THE PREFERRED EMBODIMENTS

Figure 1:
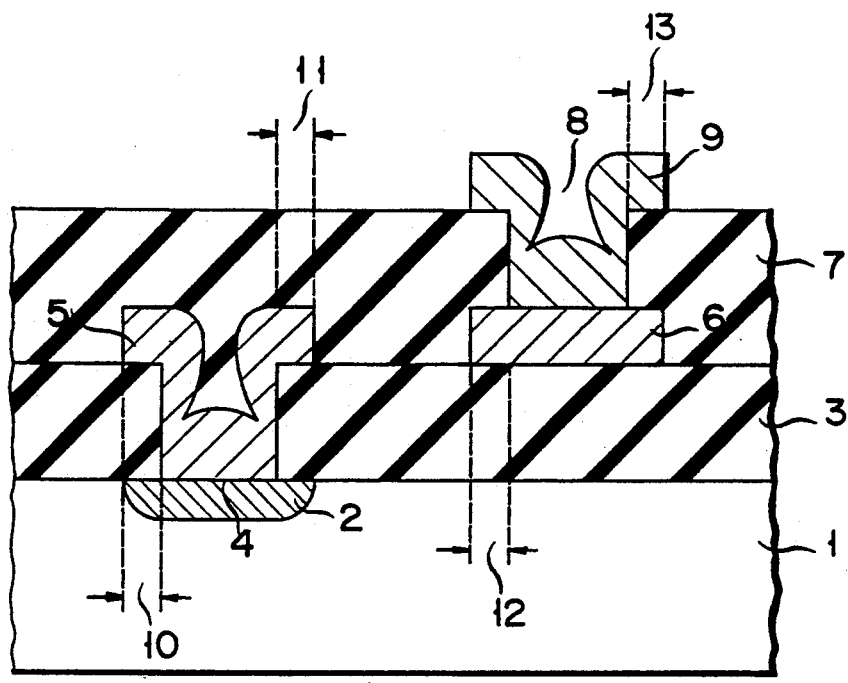
FIG. 1 is a cross section illustrating the structure of a semiconductor device including a conventional contact electrode and wiring structure.

A preferred embodiment of this invention will now be described referring to the accompanying drawings.

FIGS. 2 through 6 present cross sections illustrating the step-by-step processes of fabricating a contact electrode and metal wirings for use in a semiconductor device according to one embodiment of the present invention.

After a well region is formed on a semiconductor substrate 21 by a well-known method, device separation is performed (not shown). An impurity is selectively doped into the substrate 21 on a device region so as to form a diffusion region 22, as shown in FIG. 2. Then, a $SiO_2$ film 23 is deposed by a CVD (Chemical Vapor Deposition) method, followed by deposition of a borophosphosilicate glass (BPSG) film 24 thereon also by the CVD method, then a surface is flattened in a low-temperature reflow step, thereby forming a first interlayer insulating film 25. Further, a first buffer layer 26, made of polycrystalline silicon, for example, is formed approximately 0.2 $\mu m$ thick by the LP-CVD method, and an oxidized film 27 is formed on the buffer layer 26. Various methods such as thermal oxidation or CVD may be applied to form the film 27.

As shown in FIG. 3, a first opening 28 is formed in the upper portion of the diffusion region 22 using RIE techniques. Forming the opening 28 requires two types of RIE techniques: the first RIE technique using etching gas to etch the polycrystalline silicon buffer layer 26, and the second RIE technique using etching gas to etch oxidized films sandwiching the buffer layer 26. In etching the insulating film 25 by the second RI technique, the etching is stopped around the boundary between the $SiO_2$ film 23 and the BPSG film 24, utilizing the difference in etching rate for these two films. $SiO_2$ film 23 and the BPSG film 24 constitute the interlayer insulating film 25. As a result of the etching process, the opening 28 is formed with its bottom located at the middle portion in the interlayer insulating film 25.

A second buffer layer 29, made of polycrystalline silicon for example, is formed about 0.3 $\mu m$ thick, and is etched back by the first RIE technique, remaining on the sidewall of the first opening 28, as shown in FIG. 4.

At the etch-back time by the first RIE technique, the oxidized film 27 serves as a stopper film. Using the first and second buffer layers 26 and 29 as masks, a contact hole 30 is formed by the second RIE technique to expose part of the diffusion region 22 on the substrate surface.

Figure 5:
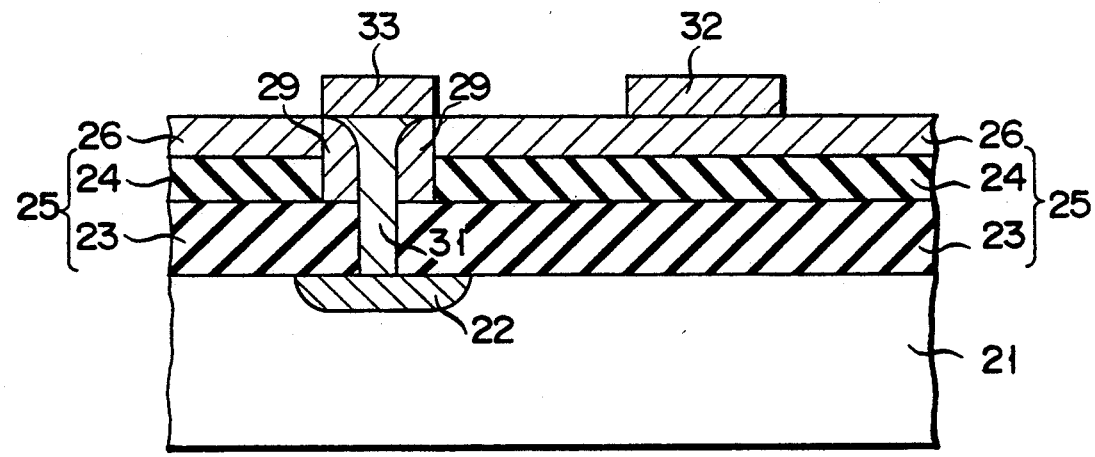

As shown in FIG. 5, a W (tungsten) film 31 is deposited in the contact hole 30 and on the first buffer layer 26 by the CVD method at a low temperature of approximately 260° C., using a $WF_6/SiH_4$ reduction basis. Then, the etch-back is performed with a plasma-etching technique, allowing the W film 31 to fill only the contact hole 30. On the etched-back main surface, an Al-Si-Cu alloy is sputtered, and patterned to form a first wiring layer 32, and also a contact electrode 33, about the size of the opening 28.

The first buffer layer 26 lying under the first wiring layer 32 serves to improve the adhesion between the wiring layer 32 and the interlayer insulating film 25, and also serves as a buffer layer to selectively grow Cu if the material of the wiring layer 32 is changed to Cu from an Al alloy. The second buffer layer 29 on the sidewall of the contact hole serves as a barrier layer against doping of B (boron) and P (phosphorus) from the BPSG film 24 of the interlayer insulating film 25, and also serves as a W nucleus site at the time of growing W in the contact hole 30.

Figure 6:
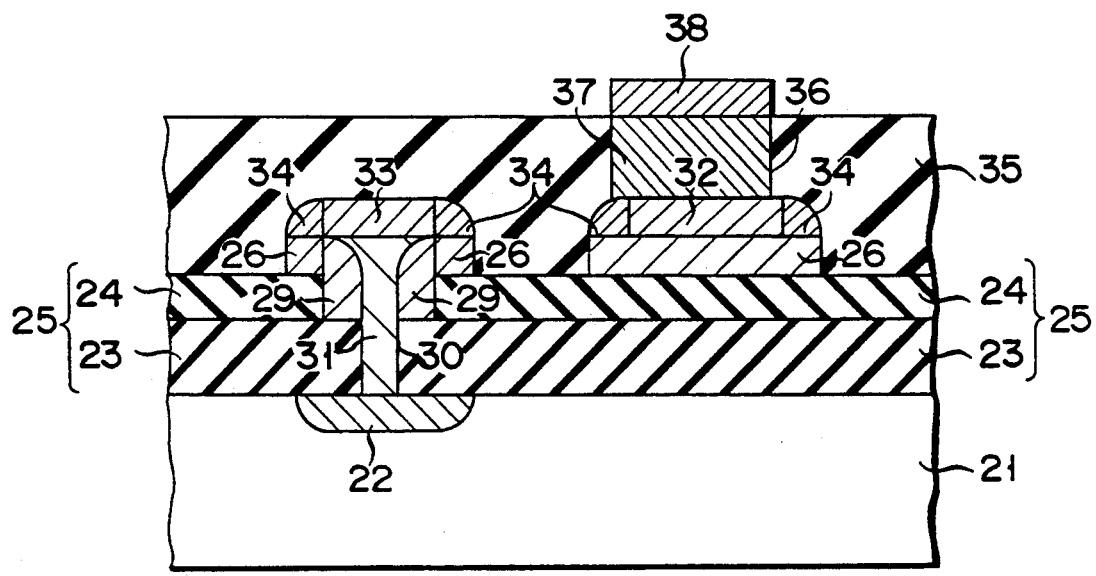

Then, using a plasma CVD method ($SiH_4$ reductive method) at a low temperature of 250° to 350° C., a third buffer layer 34, made of amorphous silicon, for example, is deposited about 0.2 to 0.3 $\mu m$ thick, and is etched back by the RIE technique, as shown in FIG. 6. As a result, the first and second buffer layers 26 and 29 are etched leaving the first layer 26 at the lower peripheral portions of the first wiring layer 32 and the contact electrode 33, and leaving the third buffer layer 34 only on the sidewalls of the first wiring layer 32 and the contact electrode 23. Then, a second interlayer insulating film 35 is formed by the plasma CVD method, then flattened by the etch-back method to bore a VIA hole 36 that expose the first wiring layer 32. A W film 37 is selectively deposited in the VIA hole 36 by the low-temperature CVD method in the same manner as described earlier with reference to FIG. 5. The second wiring layer 38 consisting of an Al-Si-Cu alloy, is vapor-deposited and patterned to lie on the W film 37.

According to the method of the above embodiment, the sidewall (second buffer layer 29) formed on part of the sidewall of the contact hole 30 will have effective alignment tolerances for the diffusion region 22 and the contact electrode 33 at the time of forming the contact hole. With this structure, if the gate electrode is formed on the substrate 21 with the diffusion region in between, it is possible to form the diffusion region smaller, and facilitate miniaturization of devices.

The sidewall (third buffer layer 34) of the first wiring layer 32 is an effective tolerance for the first wiring layer 32 at the time of forming the VIA hole 36. The wiring layer 32 and the contact electrode 33 with the sidewalls (buffer layers 34) have a trapezoidal shape with the top narrower than the bottom. This makes it easier to flatten the interlayer insulating film 35. Further, because of the W film 37 filled in the VIA hole 36, no contact alignment tolerance is required for the second wiring layer 38 formed on the W film 37.

According to the above embodiment, although W (tungsten) is used to fill the contact hole 30, a high-melting point metal, besides polycrystalline silicon and W, may also be used. Further, the first wiring layer 32 may be formed directly on the interlayer insulating film 25, instead of its deposition on the first buffer layer 26.

According to the present invention as described above, since the wiring structure is designed such that the contact electrode and the wiring layers have sidewalls formed as effective mask alignment tolerances, it is unnecessary to positively provide particular mask alignment tolerances with predetermined values. It is therefore possible to provide a miniaturized and highly reliable semiconductor device and a method of fabricating the same.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device having a miniaturized contact electrode and wiring structure, comprising:
   a semiconductor substrate;
   a first interlayer insulating film on said semiconductor substrate;
   a first buffer layer on said first interlayer insulating film;
   a first opening in said first interlayer insulating film so as to expose a surface of said semiconductor substrate;
   a second buffer layer consisting essentially of silicon in contact with said first buffer layer and said interlayer insulating film on an upper portion of said first opening;
   a first high-melting-point metal wiring conductor in said first opening to be electrically connected to said surface of said semiconductor substrate;
   a first wiring layer selectively on said first interlayer insulating film;
   a contact electrode selectively on said first high-melting-point metal wiring conductor and being of the same layer as said first wiring layer;
   a third buffer layer consisting essentially of silicon being sidewalls of said first wiring layer and said contact electrode;
   a second interlayer insulating film for covering said first wiring layer and said contact electrode;
   a second opening in said second interlayer insulating film so as to expose said first wiring layer;
   a second high-melting point metal wiring conductor in said second opening to be selectively electrically connected to said first wiring layer; and
   a second wiring layer electrically connected to said second high-melting point metal wiring conductor, said second wiring layer having essentially no contact alignment tolerance.

2. A semiconductor device according to claim 1, wherein the size of said first opening is narrowed by said second buffer layer.

3. A semiconductor device according to claim 1, wherein the size of said first opening is narrowed by said second buffer layer.

4. A semiconductor device according to claim 1 wherein said first wiring layer selectively on said first interlayer insulating film lies on said first buffer layer deposited on said first interlayer insulating film.

5. A semiconductor device according to claim 1, wherein said first interlayer film comprises at least two types of layers having different etching rate.

6. A semiconductor device having a miniaturized wiring structure, comprising:
   a semiconductor substrate;
   a first interlayer insulating film on said semiconductor substrate;
   a first wiring layer selectively positioned on said first interlayer insulating film;
   a buffer layer consisting essentially of silicon forming sidewalls of said first wiring layer;
   a second interlayer insulating film for covering said first wiring layer and said buffer layer;
   a VIA hole in said second interlayer insulating film so as to expose said first wiring layer;
   a high-melting-point metal in said VIA hole that is connected to said first wiring layer; and
   a second wiring layer electrically connected to said high-melting-point metal, said second wiring layer having essentially no contact alignment tolerance.

7. A semiconductor device having a miniaturized wiring structure, comprising:
   a semiconductor substrate;
   a first interlayer insulating film on said semiconductor substrate;
   a first wiring layer selectively positioned on said first interlayer insulating film;
   a buffer layer consisting essentially of silicon forming sidewalls of said first wiring layer;
   a second interlayer insulating film for covering said first wiring layer and said buffer layer;
   a VIA hole in said second interlayer insulating film so as to expose said first wiring layer;
   a tungsten wiring conductor in said VIA hole that is connected to said first wiring layer; and
   a second wiring layer electrically connected to said tungsten wiring conductor, said second wiring layer having essentially no contact alignment tolerance.

* * * * *